United States Patent [19]

Yoshida

[11] Patent Number: 5,181,086

[45] Date of Patent: Jan. 19, 1993

[54] STRAINED SUPERLATTICE SEMICONDUCTOR STRUCTURE

[75] Inventor: Naohito Yoshida, Itami, Japan

[73] Assignee: Mitsubishi Denki Kabushiki Kaisha, Tokyo, Japan

[21] Appl. No.: 698,150

[22] Filed: May 10, 1991

[30] Foreign Application Priority Data

May 17, 1990 [JP] Japan .................... 2-130018

[51] Int. Cl.$^5$ ............................................. H01L 33/00
[52] U.S. Cl. ........................ 257/18; 372/45; 372/46; 372/47; 385/8; 257/21; 257/22; 257/14
[58] Field of Search .................. 385/4, 8; 357/17, 16, 357/4; 372/43, 44, 45, 46, 47

[56] References Cited

U.S. PATENT DOCUMENTS

| | | | |
|---|---|---|---|
| 4,804,639 | 2/1989 | Yablonovitch | 357/17 X |
| 4,841,531 | 6/1989 | Kondow et al. | 372/43 |
| 4,860,297 | 8/1989 | Hayakawa et al. | 372/45 |
| 5,012,486 | 4/1991 | Luryi et al. | 372/45 |
| 5,048,036 | 9/1991 | Scifres et al. | 357/17 X |

FOREIGN PATENT DOCUMENTS

| | | |
|---|---|---|
| 0353054 | 1/1990 | European Pat. Off. . |
| 60-249380 | 12/1985 | Japan . |
| 61-96726 | 5/1986 | Japan . |
| 61-278186 | 12/1986 | Japan . |
| 63-136592 | 6/1988 | Japan . |
| 63-197391 | 8/1988 | Japan . |
| 2207283 | 6/1988 | United Kingdom . |

OTHER PUBLICATIONS

Katsuyama et al., "Lifetime Test for High-Current-Injection Strained-Layer Superlattice Light-Emitting Diode", I.E.E.E. Electron Device Letters, vol. EDL-8, No. 5, May 1987, pp. 240-242.
Kobayashi et al., "Growth of a ZnSe-ZnTe Strained-Layer Superlattice on an InP Substrate by Molecular Beam Epitaxy", Appl. Phys. Lett. 48(4), Jan. 27, '86, 296-7.
Osbourn et al., "A GaAs$_x$P$_{1-x}$/GaP Strained-Layer Superlattice", Appl. Phys. Lett., vol. 41, No. 2, Jul. 15, 1982, pp. 172-174.
Vuong et al., "Tunneling in In$_{0.53}$Ga$_{0.47}$As-InP Double-Barrier Structures", Appl. Phys. Lett., 50(4) Jan. 26, 1987, pp. 212-214.
Chow et al., "Growth and Characterization of InAs/-Ga$_{1-x}$In$_x$SB Strained-Layer Superlattices", Appl. Phys. Lett., 56(15) Apr. 9, 1990, pp. 1418-1420.
Das et al., "Performance Characteristics of InGaAs/-GaAs and GaAs/InGaAlAs Coherently Strained Superlattice Photodiodes", Appl. Phys. Lett., 51(15), Oct. 12, 1987, pp. 1164-1166.
Peng et al., "Extremely Low resistance Nonalloyed Ohmic Contacts on GaAs Using InAs/InGaAs and InAs/GaAs Strained-Layer Superlattices", Appl. Phys. Lett., 53(10); Sep. 5, 1988, pp. 900-901.
Das et al., "Variation of Refractive Index in Strained In$_x$Ga$_{1-x}$As—GaAs Heterostructures", J. Appl. Phys. 58(1), Jul. 1, 1985, pp. 341-344.
Shieh et al., "Critical Thickness In Strained-Layer GaInAs/GaAs Quantum Well Lasers", Aug. 31, 1989, pp. 1226-1228.
Quillec et al., "Growth and Characterization of In$_x$Ga$_{1-x}$As/In$_y$Ga$_{1-y}$As Strained-Layer Superlattice On InP Substrate", Journal of Applied Physics, vol. 59, No. 1, 1986, pp. 2447-2450.
Katsuyama et al., "Lifetime Test for High-Current-Injection Strained-Layer Superlattice Light-Emitting Diode", IEEE Electron Device Letters, EDL-8, 1987, pp. 240-242.
Koren et al., "Low Threshold Highly Efficient Strained Quantum Well Lasers at 1.5 Micrometer Wavelength", Electronics Letters, vol. 26, No. 7, 1990, pp. 465-466.

Primary Examiner—William Mintel
Attorney, Agent, or Firm—Leydig, Voit & Mayer

[57] ABSTRACT

A semiconductor structure for a light-interactive semiconductor device includes first and second crystalline semiconductor cladding layers having a first lattice constant and a strained superlattice structure disposed in contact with and between the first and second cladding layers and including alternating first crystalline semiconductor quantum barrier layers having a first and second crystalline semiconductor quantum well layers having a second energy band gap less than the first energy band gap and a third lattice constant wherein the first lattice constant is approximately equal to the average of the second and third lattice constants and the second lattice constant differs from the third lattice constant by at least 0.5 percent of the second lattice constant.

9 Claims, 4 Drawing Sheets

F I G. 2(a)
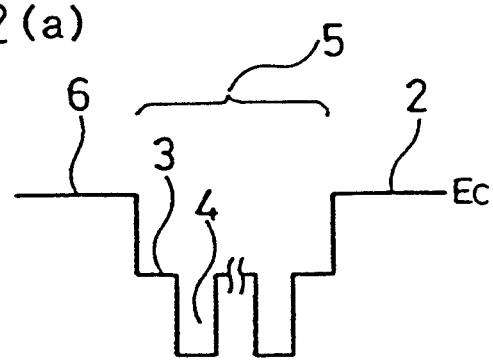
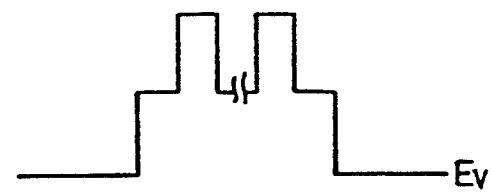
F I G. 2(b)
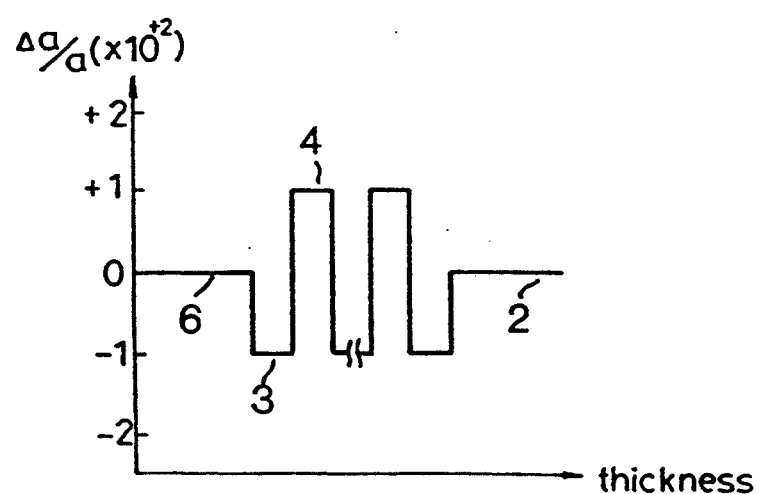

STRAINED SUPERLATTICE SEMICONDUCTOR STRUCTURE

FIELD OF THE INVENTION

The present invention relates to a strained superlattice semiconductor structure that is light-interactive and particularly to an optical waveguide, a light beam deflecting device, and a semiconductor laser incorporating the strained superlattice semiconductor structure.

BACKGROUND OF THE INVENTION

Semiconductor superlattice structures including alternating quantum well and quantum barrier layers are well known. In the basic unit of these structures, a thin semiconductor layer having a relatively narrow energy band gap is sandwiched between thin layers of a different semiconductor material having a relatively wide energy band gap. A quantum well is thus formed in which charge carriers can be confined and from which, under appropriate circumstances, charge carriers can escape by tunneling or another charge carrier transport mechanism. In a multiple quantum well structure, a plurality of these basic units are sequentially disposed. Superlattice structures including one or more quantum wells have found applications in numerous semiconductor devices including semiconductor lasers and other light-interactive devices.

When the different crystalline semiconductor materials used in the quantum well layers and in the quantum barrier layers have different lattice constants, an atomic mismatch between adjacent crystalline layers occurs. The lattice mismatching of the crystalline structures adjacent each of the quantum well/quantum barrier layer interfaces causes strain in the layers and affects the electrical characteristics of the structure. While considerable effort has been devoted to producing superlattice structures essentially free of strain, in recent years it has been determined that beneficial results can be achieved if some strain is present in a superlattice structure. For example, wavelength of the light produced by a semiconductor laser incorporating a so-called strained superlattice structure as the active layer can be shifted compared to a similar semiconductor laser employing a superlattice structure active layer free of strain. In addition, semiconductor lasers incorporating strained superlattice structures exhibit lower threshold currents for laser oscillation and lower operating currents than similar semiconductor lasers without superlattice structures.

While strain in a superlattice structure can produce beneficial effects in a device incorporating the strained superlattice structure, an excessive amount of strain can cause detrimental effects and even prevent device operation. Assuming each quantum well layer and quantum barrier layer interface introduces the same amount of strain into a superlattice structure, the total strain present in prior art structures is equal to the product of that strain and the number of such interfaces in the strained superlattice structure. Generally, the strain at each interface between a quantum well layer and quantum barrier layer is directly related to the difference between the lattice constants of the semiconductor materials employed in the quantum well and quantum barrier layers. When the total strain in a superlattice structure exceeds a critical value, the dislocation density in the semiconductor layers increases significantly, resulting in a severe deterioration of the crystallinity of subsequently grown semiconductor layers that adversely affect the characteristics of a device, such as a laser, incorporating the structure.

An example of a semiconductor laser incorporating a strained superlattice structure as an active layer was described by Shieh et al in *Electronics Letters*, Volume 18, Number 25, 1989, pages 1226–1228. In that laser structure, cladding layers of $Al_{0.2}Ga_{0.8}As$ sandwiched light guide layers of gallium arsenide (GaAs) which, in turn, sandwiched a strained superlattice structure active layer. The well layers in the strained superlattice structure were $Ga_{0.8}In_{0.2}As$ and the barrier layers were GaAs. Those authors prepared a number of such semiconductor laser structures including 1 and 3–6 quantum wells, respectively.

In FIG. 4(a), an idealized energy band structure of the strained superlattice laser described by Shieh is schematically shown. Quantum barrier layers 13 sandwich quantum well layers 14 of the strained superlattice structure 15. The outermost quantum well layers lie adjacent to the respective GaAs light guide layers 17. The light guide layers are, in turn, sandwiched by the $Al_{0.2}Ga_{0.8}As$ cladding layers 12 and 16.

FIG. 4(b) is a graph of the degree of lattice mismatch, $\Delta a/a$, as a function of position within the Shieh laser structure where a is the lattice constant of GaAs. The graph of FIG. 4(b) is plotted as the percent of lattice mismatch. Thus, in the cladding layer 16 and the light guide layer 17 adjacent cladding layer 16, the lattice mismatching is zero because aluminum arsenide (AlAs) and GaAs have essentially the same lattice constant. In the strained superlattice structure 15, the lattice mismatch with the cladding and light guide layers is about plus 1.4 percent for the quantum well layers and zero percent for the quantum barrier layers. In other words, as the strained superlattice structure 15 is grown on the light guide layer 17, the strain increases, i.e., accumulates, with each quantum well layer and quantum barrier layer that is grown. The total strain within the laser structure constantly increases with additional superlattice layers so that the advantages of the strained superlattice structure gradually decline with an increasing number of quantum wells. In fact, as shown in Shieh's FIG. 2, threshold current density increases with increasing quantum wells and increases unacceptably in a structure including six quantum wells. At that point, the total strain has become so large that it totally overwhelms the improvements achieved by employing the strained superlattice structure.

Because of the increasing strain and the adverse effects of strain within a strained superlattice structure as the number of quantum wells is increased, the performance improvement that can be achieved in light-interactive semiconductor devices incorporating strained superlattice structures is limited. These strain limitations prevent the use of an arbitrary number of quantum wells in a strained superlattice structure and limit the practical realization of light-interactive devices incorporating strained superlattice structures.

SUMMARY OF THE INVENTION

It is an object of the invention to provide a strained superlattice semiconductor structure that may include an arbitrary number of quantum wells without the adverse effect of accumulated strain.

It is another object of the invention to provide a light-interactive semiconductor device including a strained superlattice semiconductor structure that may include an arbitrary number of quantum wells without the adverse effect of accumulated strain.

It is yet another object of the invention to provide a semiconductor laser including a strained superlattice semiconductor structure that may include an arbitrary number of quantum wells without the adverse effect of accumulated strain.

A semiconductor structure for a light-interactive semiconductor device according to the invention includes first and second crystalline semiconductor cladding layers having a first lattice constant and a strained superlattice structure disposed in contact with and between the first and second cladding layers and including alternating first crystalline semiconductor quantum barrier layers having a first energy band gap and a second lattice constant and second crystalline semiconductor quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant.

A light-interactive semiconductor device according to the invention includes a semiconductor substrate, a first crystalline semiconductor cladding layer disposed on the semiconductor substrate and having a first lattice constant, a strained superlattice structure disposed on the first cladding layer and including alternating first crystalline semiconductor quantum barrier layers having a first energy band gap and a second lattice constant and second crystalline semiconductor quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant, a second crystalline semiconductor cladding layer disposed on the strained superlattice structure opposite the first cladding layer, and first and second electrodes respectively disposed on the first and second cladding layers.

A semiconductor laser according to the invention includes a first conductivity type semiconductor substrate, a first conductivity type crystalline semiconductor cladding layer disposed on the semiconductor substrate and having a first lattice constant, a strained superlattice structure disposed on the first cladding layer and including alternating first crystalline semiconductor quantum barrier layers having a first energy band gap and a second lattice constant and second crystalline semiconductor quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant, a second conductivity type crystalline semiconductor cladding layer disposed on the strained superlattice structure opposite the first cladding layer, and first and second electrodes respectively disposed on the first and second cladding layers.

Other objects and advantages of the present invention will become apparent from the detailed description that follows. It should be understood, however, that the detailed description is given by way of illustration only, since various additions and modifications within the spirit and scope of the invention will become apparent to those skilled in the art from the detailed description.

BRIEF DESCRIPTION OF THE DRAWINGS

FIG. 2(a) is an energy band diagram of the strained superlattice structure of FIG. 1.

FIG. 2(b) is a graph of the degree of lattice mismatch as a function of position in the strained superlattice structure of FIG. 2(a).

DETAILED DESCRIPTION OF PREFERRED EMBODIMENTS

Figure 1:
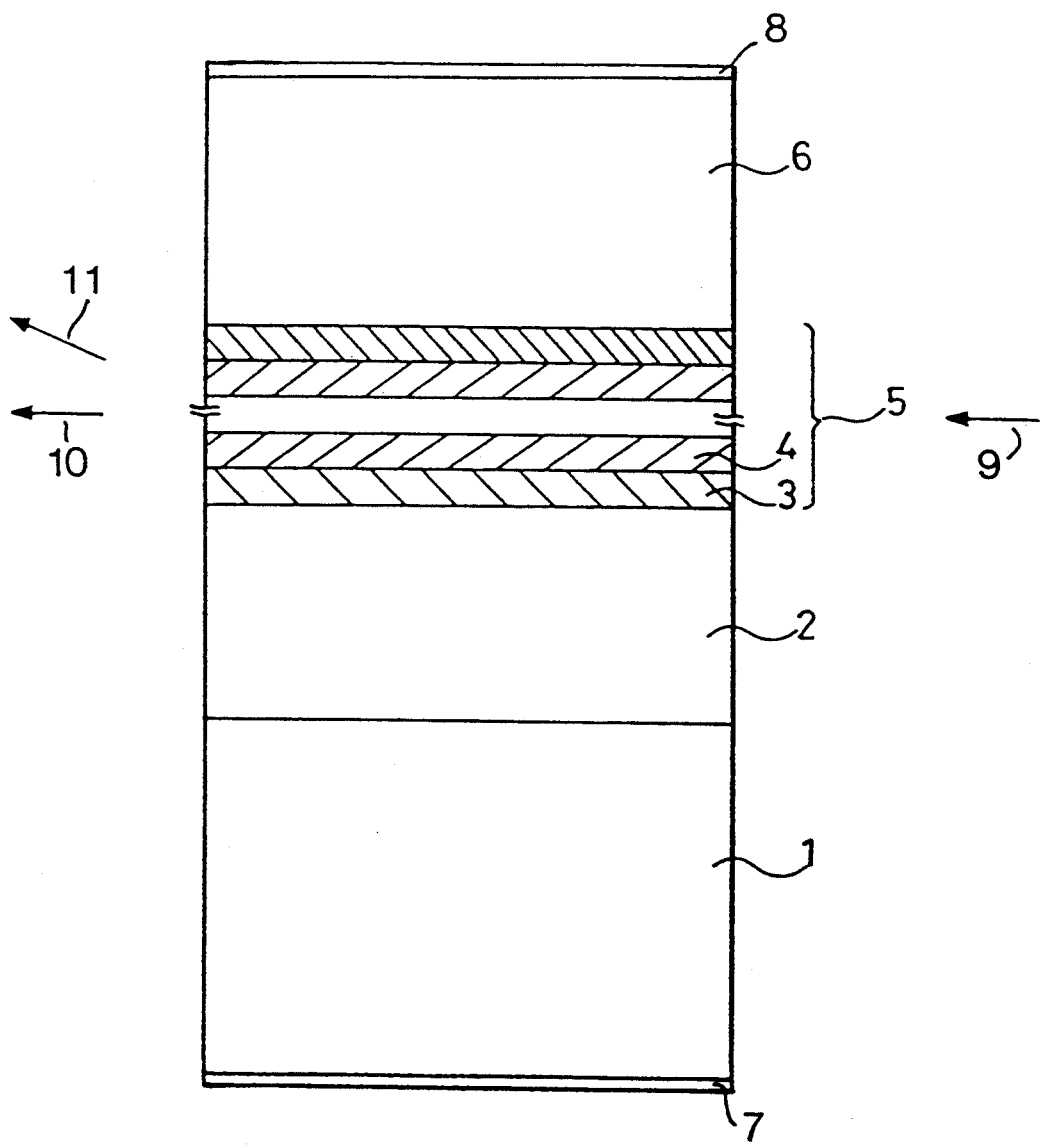
FIG. 1 is a schematic cross-sectional view of a semiconductor device including a strained superlattice structure according to the invention.

FIG. 1 is a schematic cross-sectional view of a light-interactive semiconductor device incorporating a strained superlattice structure. The device includes a substrate 1 on which a cladding layer 2 is disposed. A strained superlattice structure 5 is disposed on the cladding layer 2 and includes a plurality of alternatingly disposed quantum barrier layers 3 and quantum well layers 4. A second cladding layer 6 is disposed on the strained superlattice structure 5. Electrodes 7 and 8 are disposed on the substrate 1 and second cladding layer 6, respectively, for passing a current through the strained superlattice structure transverse to the thicknesses of the layers 3 and 4.

In one embodiment of the device, the substrate 1 may be an n-type indium phosphide (InP) substrate on which the first cladding layer 2 of InP is grown by metal organic chemical vapor deposition (MOCVD). The strained superlattice structure 5 is formed by alternatingly and successively growing quantum barrier layers 3 of, for example, $In_{0.35}Ga_{0.65}As$ about 100 Angstroms thick and quantum well layers of, for example, $In_{0.7}Ga_{0.3}As$ about 100 Angstroms thick. In one exemplary device, eleven quantum barrier layers and ten quantum well layers are grown. These quantum well and quantum barrier layers may be grown by MOCVD or by molecular beam epitaxy (MBE). Finally, a second cladding layer 6 is grown on the strained superlattice structure 5 and the electrodes 7 and 8 are formed to complete the device structure. Generally, the substrate 1 and the first cladding layer 2 are of the same conductivity type and the second cladding layer 6 is of a second, opposite conductivity type from the first cladding layer 2.

Figure 4A:
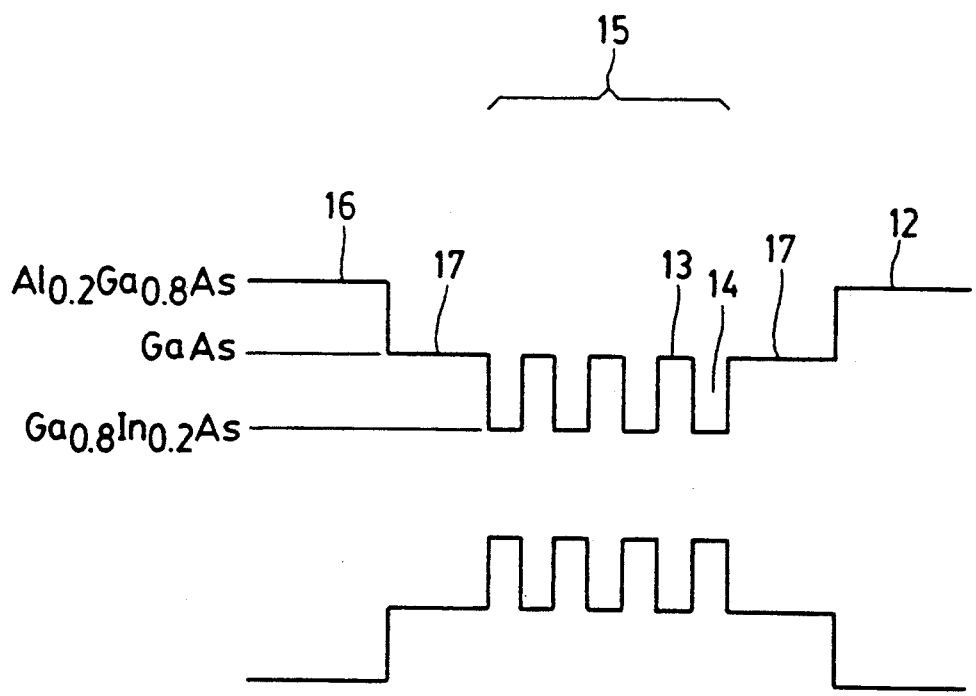
FIG. 4(a) is an energy band diagram of a portion of a semiconductor laser incorporating a strained superlattice structure active layer according to the prior art.

An energy band diagram of the central portion of the device of FIG. 1 centered about the strained superlattice structure 5 is shown in FIG. 2(a). The repetitive quantum well and quantum barrier layers 3 and 4 are abbreviated as indicated in FIG. 2(a). Generally, the energy band structure of FIG. 2(a) is identical to that of the energy band structure of prior art FIG. 4(a), although the number of quantum wells included in the structure of FIG. 2(a) is larger.

In FIG. 2(b), a graph of the percentage of lattice mismatch within the central portion of the device of FIG. 1 is plotted as a function of position within that structure. The structural elements of FIG. 1 are indicated in the graph of FIG. 2(b). As indicated by the vertical lines in FIG. 2(b), strain is present within the strained superlattice structure 5 just as it is present in the strained superlattice structure 15 of the prior art structure. However, by comparing FIGS. 2(b) and 4(b), it can be seen that the strain caused by the lattice mismatch does not accumulate in the structure of FIG. 1 as it does in the structure of FIG. 4(b).

Figure 4B:
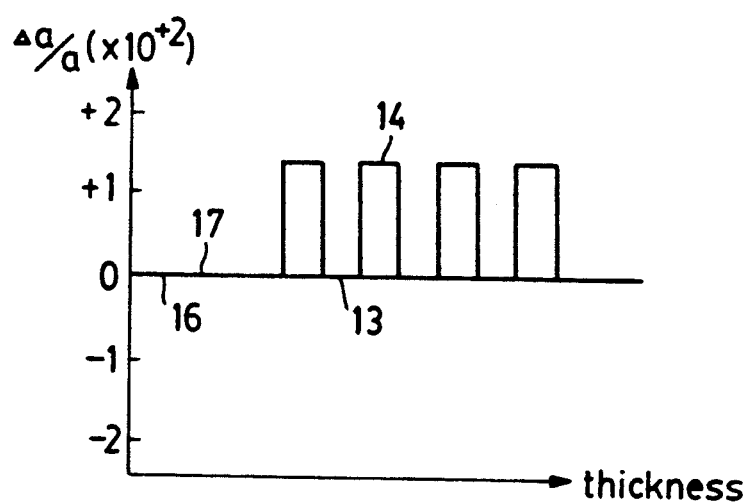
FIG. 4(b) is a graph of the degree of lattice mismatch as a function of position in the strained superlattice structure of FIG. 4(a).

In FIG. 4(b), the lattice mismatches relative to the cladding layer 17 are all in one direction. By contrast, in the structure of FIG. 2(b), the lattice mismatch at the interface of the cladding layer 6 and the first quantum barrier layer 3 is in one direction, i.e., the lattice constant decreases. At the next interface, between the first quantum barrier layer 3 and the first quantum well layer 4, the lattice mismatch, i.e., strain, changes in sign, i.e., direction, to a magnitude approximately equal to the lattice mismatch between the cladding layer 6 and the first quantum barrier layer 4. This alternating pattern in the direction of lattice mismatch relative to the cladding layer 6 with a substantial balance in the magnitudes of the lattice mismatches of opposite directions continues through the strained superlattice structure 5. In other words, the average of the lattice constants of the quantum well and quantum barrier layers is approximately equal to the lattice constant of the cladding layer. Because of the changes in direction of the lattice mismatches and the substantial balancing of the oppositely directed strains as a result of the mismatches, the accumulated strain with the strained superlattice structure is maintained at a relatively low total value. On the other hand, because of the presence of the lattice mismatches, the desired strain at the interfaces between quantum barrier and quantum well layers is still present in the novel structure.

The desired effect illustrated in FIG. 2(b) is achieved by choosing the materials of the cladding, quantum well, and quantum barrier layers considering their respective lattice constants. A brief table of some lattice constants for semiconductor materials illustrates the material selection process.

| Semiconductor Compound | Lattice Constant |
|---|---|
| AlP | 5.45 Angstroms |
| GaP | 5.45 Angstroms |
| GaAs | 5.65 Angstroms |
| AlAs | 5.66 Angstroms |
| InP | 5.87 Angstroms |
| InAs | 6.06 Angstroms |

According to Vegard's Law, the lattice constant of a ternary crystalline compound semiconductor can be found by interpolating between the lattice constants of the two crystalline binary compound semiconductors from which the ternary compound semiconductor is formed. Applying the foregoing Table, the lattice constant within the prior art strained superlattice structure of FIG. 4(a) varies from the GaAs lattice constant of the barrier layers of 5.65 Angstroms to the lattice constant of 5.73 of the ternary compound of the quantum well layers. In the specific embodiment of the invention described above, the lattice constant of the quantum barrier layers is 5.78 Angstroms and the lattice constant of the quantum well layers is 5.94 Angstroms. The average of those lattice constants substantially equals the lattice constant of 5.87 Angstroms of the InP cladding layers 2 and 6. Thus, during the fabrication of the device of FIG. 1, the total strain produced by growing one pair of layers of the superlattice structure is compensated for, to a large degree, by the strain between the second of those layers and the next, i.e., third, layer grown. As a result, the dislocation density produced in the growth process is controlled so that a relatively large number of quantum well and quantum barrier layers can be grown without cumulative strain that adversely affects the electrical characteristics of a device incorporating the structure.

By comparison, if InP were used for the barrier layer of the strained superlattice structure of FIG. 1 instead of $In_{0.35}Ga_{0.65}As$, producing a degree of lattice mismatch graph like that of FIG. 4(b), a so-called cross-hatched surface morphology would be produced. That surface morphology indicates a very high density of dislocations that interfere with the crystallinity of the grown layers.

In the specific example of FIGS. 1, 2(a), and 2(b), the lattice mismatch has an amplitude of about 2 percent and is about plus and minus 1 percent with reference to the lattice constant of the InP cladding layer. The desired effects produced by strained superlattice structures have been observed with lattice mismatches of as little as 0.5 percent but have been difficult to observe with lattice mismatches of 0.4 percent and below. Therefore, to produce a strained superlattice structure according to the invention, the degree of lattice mismatch between a cladding layer and the quantum well and quantum barrier layers should be greater than about 0.5 percent, although the minimum degree of mismatch cannot be specified with precision. Most preferably, the average of the lattice constants of the quantum well and quantum barrier layers is equal to the lattice constant of the cladding layer, but precise equality is not essential to the invention.

Figure 2C:
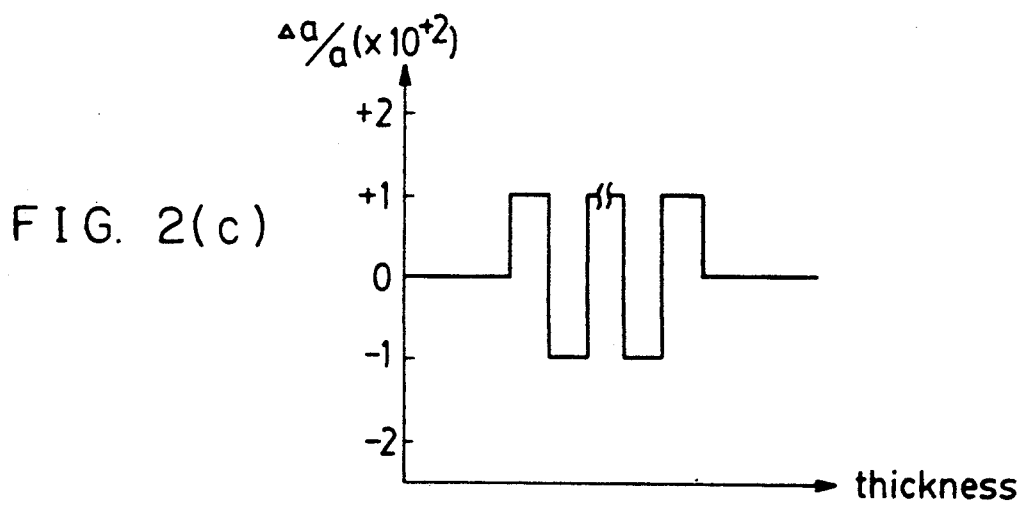
FIG. 2(c) is a graph of the degree of lattice mismatch as a function of position in a strained superlattice structure according to the invention.

In the strained superlattice structure described with respect to FIGS. 1, 2(a), and 2(b), the lattice constant of the quantum well layers is larger than the lattice constant of the quantum barrier layers. However, that relationship can be reversed so that a graph of the degree of lattice mismatch as a function of position within the structure would be as shown in FIG. 2(c). Although the embodiment of the invention shown in FIG. 1 is described with respect to specific materials and conductivity types, the substrate 1 may be an insulating or semi-insulating substrate and other compound semiconductor materials besides InP, such as those listed in the foregoing Table, may be employed as the substrate or in the cladding layers and as part of the ternary semiconductor compounds employed in the quantum well and quantum barrier layers.

The strained superlattice structure according to the invention may be employed in a large variety of light-interactive semiconductor devices. As used here, the term "light-interactive" means a semiconductor device that alters a characteristic of a beam of light or that generates light, such as a semiconductor laser. The embodiment of the invention shown in FIG. 1, for example, functions as an optical waveguide channeling a beam of incident light 9 that is generally transverse to the thicknesses of the quantum well and quantum barrier layers of the strained superlattice structure 5. The same device can function as a light beam deflecting device. For example, in the absence of an electrical bias, the incident light beam 9 traverses the strained superlattice structure and emerges as light beam 10. However, when an appropriate electrical bias is applied between electrodes 7 and 8, the characteristics of the optical waveguide formed by the strained superlattice structure 5 are changed and the light passing through the strained superlattice structure is deflected to the beam direction 11 indicated in FIG. 1. Thus, the device of FIG. 1 can function as an optical switch, switching the direction of the incident light beam, and as an optical modulator when only a portion of the incident light beam is deflected from the direction 10 to the direction 11.

Figure 3:
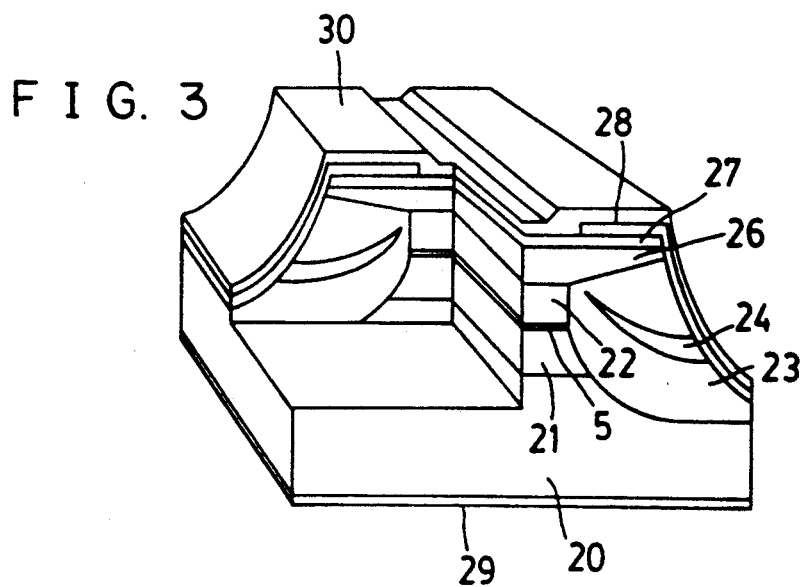
FIG. 3 is a perspective view, partly in section, of a semiconductor laser incorporating a strained superlattice structure according to an embodiment of the invention.

A particularly useful application of the novel strained superlattice structure is in a semiconductor laser, an example of which is shown in a perspective, partially sectioned, view in FIG. 3. That semiconductor laser includes a p-type InP substrate 20, a p-type InP first cladding layer 21, a strained superlattice structure 5 as the active layer, an n-type InP second cladding layer 22, an n-type InP third cladding layer 26, and an n-type InGaAsP contacting layer 27, all successively disposed. A first electrode 29 is disposed on the substrate 20 and a second electrode 30 is disposed on and in electrical contact with the contacting layer 27. An insulating film 28 separates the contacting layer 27 from the side surfaces of a mesa that includes a current blocking structure. That current blocking structure includes a p-type InP buried region 23 and an n-type InP current blocking layer 24 having a crescent shape and buried within the p-type current blocking region. In this semiconductor laser embodiment, the strained superlattice structure 5 has the same structure as described for the strained superlattice structure 5 of FIG. 1, namely, six quantum barrier layers of $In_{0.35}Ga_{0.65}As$ and five quantum well layers of $In_{0.7}Ga_{0.3}As$.

The laser structure of FIG. 3 can be manufactured using known processes. Initially, the first cladding layer 21, the strained superlattice structure 5, and the second cladding layer 22 are successively grown on the substrate 20 by MOCVD. Thereafter, a mesa is formed by masking and etching of the grown layers. After formation of the mesa, the region 23, the current blocking layer 24, the third cladding layer 26, and the contacting layer 27 are sequentially grown by liquid phase epitaxy (LPE). The formation of region 23 actually includes two separate growth steps that result in the crescent shape of the current blocking layer 24. Initially, a p-type InP layer is grown followed by the growth of the n-type current blocking layer 24. Subsequently, another p-type current blocking layer is grown by LPE. In the course of producing that second part of the p-type region 23, some of the n-type layer 24 is dissolved, resulting in the crescent shape of the current blocking layer 24 and, usually, the continuity of the two p-type layers to form the p-type region 23. The semiconductor laser structure of FIG. 3 functions in the same manner as the prior art laser described with respect to FIG. 4(a), producing laser light in response to a current flow between electrodes 29 and 30 that exceeds the threshold current. However, unlike the prior art laser, the number of quantum wells in the strained superlattice structure 5 is not limited by crystallinity considerations and may be any number of quantum wells that produces the desired electrical and optical performance of the laser.

I claim:

1. A semiconductor structure for a light-interactive semiconductor device comprising:
    first and second crystalline InP cladding layers having a first lattice constant; and
    a strained superlattice structure disposed in contact with and between the first and second InP cladding layers and comprising alternating crystalline $In_xGa_{1-x}As$ quantum barrier layers having a first energy band gap and a second lattice constant and crystalline $In_yGa_{1-y}Ga$ quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant.

2. The semiconductor structure of claim 1 wherein x is approximately equal to 0.35 and y is approximately equal to 0.7.

3. The semiconductor structure of claim 1 wherein the strained superlattice structure includes a fixed number of quantum well layers and a number of quantum barrier layers equal to the number of quantum well layers plus one.

4. A light-interactive semiconductor device comprising:
    a semiconductor substrate;
    a first crystalline InP cladding layer disposed on the semiconductor substrate and having a first lattice constant;
    a strained superlattice structure disposed on the first cladding layer and comprising alternating crystalline $In_xGa_{1-x}As$ quantum barrier layers having a first energy band gap and a second lattice constant and crystalline $In_yGa_{1-y}As$ quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant;
    a second crystalline InP cladding layer disposed on the strained superlattice structure opposite the first cladding layer; and
    first and second electrode respectively disposed on the first and second cladding layers.

5. The light-interactive semiconductor device of claim 4 wherein x is approximately equal to 0.35 and y is approximately equal to 0.7.

6. The light-interactive semiconductor device of claim 4 wherein the strained superlattice structure includes a fixed number of quantum well layers and a number of quantum barrier layers equal to the number of quantum well layers plus one.

7. A semiconductor laser comprising:
    a first conductivity type InP substrate;
    a first conductivity type crystalline InP cladding layer disposed on the semiconductor substrate and having a first lattice constant;
    a strained superlattice structure disposed on the first cladding layer and comprising alternating crystalline $In_xGa_{1-x}As$ quantum barrier layers having a first energy band gap and a second lattice constant and crystalline $In_yGa_{1-y}As$ quantum well layers having a second energy band gap less than the first energy band gap and a third lattice constant wherein the first lattice constant is approximately equal to the average of the second and third lattice constants and the second lattice constant differs from the third lattice constant by at least about 0.5 percent of the second lattice constant;

a second conductivity type crystalline InP cladding layer disposed on the strained superlattice structure opposite the first cladding layer; and first and second electrodes respectively disposed on the first and second cladding layers.

8. The semiconductor laser of claim 7 wherein x is approximately equal to 0.35, y is approximately equal to 0.7, and including a second conductivity type InGaAsP contacting layer interposed between the second cladding layer and the second electrode.

9. The semiconductor laser of claim 7 wherein the strained superlattice structure includes a fixed number of quantum well layers and a number of quantum barrier layers equal to the number of quantum well layers plus one.

* * * * *